United States Patent
Cai et al.

(10) Patent No.: US 10,901,656 B2
(45) Date of Patent: Jan. 26, 2021

(54) MEMORY SYSTEM WITH SOFT-READ SUSPEND SCHEME AND METHOD OF OPERATING SUCH MEMORY SYSTEM

(71) Applicant: SK HYNIX INC., Gyeonggi-Do (KR)

(72) Inventors: Yu Cai, San Jose, CA (US); Naveen Kumar, San Jose, CA (US); Aman Bhatia, San Jose, CA (US); Fan Zhang, Fremont, CA (US); Chenrong Xiong, San Jose, CA (US); Xuanxuan Lu, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/194,165

(22) Filed: Nov. 16, 2018

(65) Prior Publication Data
US 2019/0155546 A1    May 23, 2019

Related U.S. Application Data

(60) Provisional application No. 62/588,113, filed on Nov. 17, 2017.

(51) Int. Cl.
*G06F 3/06* (2006.01)
*G06F 11/10* (2006.01)
(Continued)

(52) U.S. Cl.
CPC .......... *G06F 3/0659* (2013.01); *G06F 3/0619* (2013.01); *G06F 3/0679* (2013.01);
(Continued)

(58) Field of Classification Search
CPC .. G06F 11/1068; G06F 3/0659; G06F 3/0611; G06F 3/0619; G06F 3/0679;
(Continued)

(56) References Cited

U.S. PATENT DOCUMENTS 7,586,783 B2    9/2009  Lee
8,627,175 B2 *  1/2014  Patapoutian .......... H03M 13/45
                                              714/763

(Continued)

OTHER PUBLICATIONS

L. Zuolo, C. Zambelli, P. Olivo, R. Micheloni and A. Marelli, "LDPC Soft Decoding with Reduced Power and Latency in 1X-2X NAND Flash-Based Solid State Drives," 2015 IEEE International Memory Workshop (IMW), Monterey, CA, 2015, pp. 1-4.*

(Continued)

*Primary Examiner* — Pierre Miche Bataille
(74) *Attorney, Agent, or Firm* — IP & T Group LLP (57) ABSTRACT

Soft read suspend schemes for a memory system reduce overall command latency and improve QoS of the memory system, which includes a memory device and a memory controller. The memory controller controls the memory device to perform, in response to a command, a hard read to generate hard information for hard decoding, and predict whether soft decoding of the data is to be performed, and if so, how many soft reads are to be performed. When hard decoding fails and soft decoding and at least one soft read is to be performed, the memory device is controlled to perform an initial soft read to generate soft information for soft decoding, predict whether, and if so, how many, subsequent soft reads are to be performed, and determine whether to perform a first subsequent soft read on the data based on the prediction.

20 Claims, 7 Drawing Sheets

(51) Int. Cl.
*G11C 29/52* (2006.01)
*G11C 29/04* (2006.01)

(52) U.S. Cl.
CPC ...... *G06F 11/1012* (2013.01); *G06F 11/1068* (2013.01); *G11C 29/52* (2013.01); *G11C 2029/0411* (2013.01)

(58) Field of Classification Search
CPC ........ G06F 11/1012; G06F 11/10; G06F 3/06; G11C 2029/0411; G11C 29/52
USPC ......................................................... 711/103
See application file for complete search history.

(56) References Cited

U.S. PATENT DOCUMENTS

| | | | | |
|---|---|---|---|---|
| 8,627,188 | B2* | 1/2014 | Weingarten | G11C 11/5621 |
| | | | | 714/794 |
| 8,943,384 | B2* | 1/2015 | Sridhara | H03M 13/1111 |
| | | | | 714/763 |
| 9,672,942 | B2* | 6/2017 | Yoon | H03M 13/45 |
| 9,954,558 | B1* | 4/2018 | Steiner | G11C 11/5642 |
| 9,966,147 | B1* | 5/2018 | Lien | G11C 11/005 |
| 10,432,363 | B2* | 10/2019 | Kumar | G06F 11/1012 |
| 10,755,787 | B2* | 8/2020 | Yazovitsky | G11C 29/52 |
| 2009/0177931 | A1* | 7/2009 | Song | G06F 11/1012 |
| | | | | 714/704 |
| 2009/0269081 | A1* | 10/2009 | Cai | H04L 1/0045 |
| | | | | 398/202 |
| 2012/0079355 | A1* | 3/2012 | Patapoutian | G11C 16/26 |
| | | | | 714/780 |
| 2013/0339784 | A1 | 12/2013 | Bickelman et al. | |
| 2014/0237315 | A1* | 8/2014 | Fitzpatrick | H03M 13/2909 |
| | | | | 714/755 |
| 2017/0269994 | A1* | 9/2017 | Maffeis | G11C 11/5642 |
| 2017/0345489 | A1* | 11/2017 | Zeng | G06F 11/1048 |
| 2018/0048434 | A1* | 2/2018 | Kumar | G11C 29/021 |
| 2018/0225042 | A1* | 8/2018 | Chen | G06F 3/0679 |
| 2019/0051360 | A1* | 2/2019 | Lien | G06F 13/16 |

OTHER PUBLICATIONS

J. Yin et al., "Advanced soft fail characterization methodology for sub-28nm nanoscale SRAM yield improvement," 25th Annual SEMI Advanced Semiconductor Manufacturing Conference (ASMC 2014), Saratoga Springs, NY, 2014, pp. 351-356.*

* cited by examiner

MEMORY SYSTEM WITH SOFT-READ SUSPEND SCHEME AND METHOD OF OPERATING SUCH MEMORY SYSTEM

CROSS-REFERENCE TO RELATED APPLICATION

This application claims the benefit of U.S. Provisional Application No. 62/588,113, filed Nov. 17, 2017, the entire contents of which are incorporated herein by reference.

BACKGROUND

1. Field

Embodiments of the present disclosure relate to a memory system with a soft-read suspend scheme, and method of operating such memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller may include an embedded processor that executes functional components such as firmware. The SSD functional components are typically device specific, and in most cases, can be updated.

The two main types of flash memories are named after the NAND and NOR logic gates. The individual flash memory cells exhibit internal characteristics similar to those of their corresponding gates. The NAND-type flash memory may be written to and read from in blocks (or pages) which are generally much smaller than the entire memory space. The NOR-type flash allows a single machine word (byte) to be written to an erased location or read independently. The NAND-type flash memory operates primarily in memory cards, USB flash drives, solid-state drives (SSDs), and similar products, for general storage and transfer of data.

A flash-memory SSD applies advanced error correction codes, such as low-density parity-check code (LDPC), to recover a relatively large number of errors in data. Such error correction code (ECC) processing generates soft information for decoding, which requires multiple reads of the memory for the same data. A first read using a reference threshold voltage set to differentiate the bit value of a cell as either 0 or 1 is performed for hard decoding. If hard decoding fails, multiple additional reads, e.g., about 7, are performed at different voltages, greater and/or less than the reference threshold voltage. The information collected from all of these additional reads is combined to generate soft information, which is used in applying more powerful error correction decoding to recover errors in the data.

While soft decoding helps to recover errors, the additional reads required to obtain sufficient soft information increases latency. If one soft read takes 100 µs, the total read time is up to 700 µs, if successful soft decoding requires seven soft reads. To make the situation worse, such a large latency caused by the multiple soft reads and decoding may block execution of read commands further down the queue. The overall affect is that the Quality of Service (QoS) of the SSD is reduced.

In this context embodiments of the present invention arise.

SUMMARY

Aspects of the present invention include memory systems. Such a memory system comprises a memory device, and a memory controller. The memory controller is configured to control the memory device to perform, in response to a command in a queue of commands, a hard read to read data from the memory device to generate hard information for hard decoding; and predict whether soft decoding of the data is to be performed, and if so, how many soft reads are to be performed for the soft decoding. The memory controller may be further configured to control the memory device to perform an initial soft read to read the data from the memory device to generate soft information for soft decoding when hard decoding fails and it is determined that soft decoding is to be performed and at least one soft read is to be performed; predict whether, and if so, how many, subsequent soft reads are to be performed for soft decoding of the data; and determine whether to perform a first subsequent soft read on the data based on the prediction.

Further aspects of the present invention include methods, particularly methods of operating memory systems comprising steps or operations commensurate with the functionality and processing described above with respect to the memory systems.

Additional aspects of the present invention will become apparent from the following description.

DETAILED DESCRIPTION

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrases are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

Figure 1:
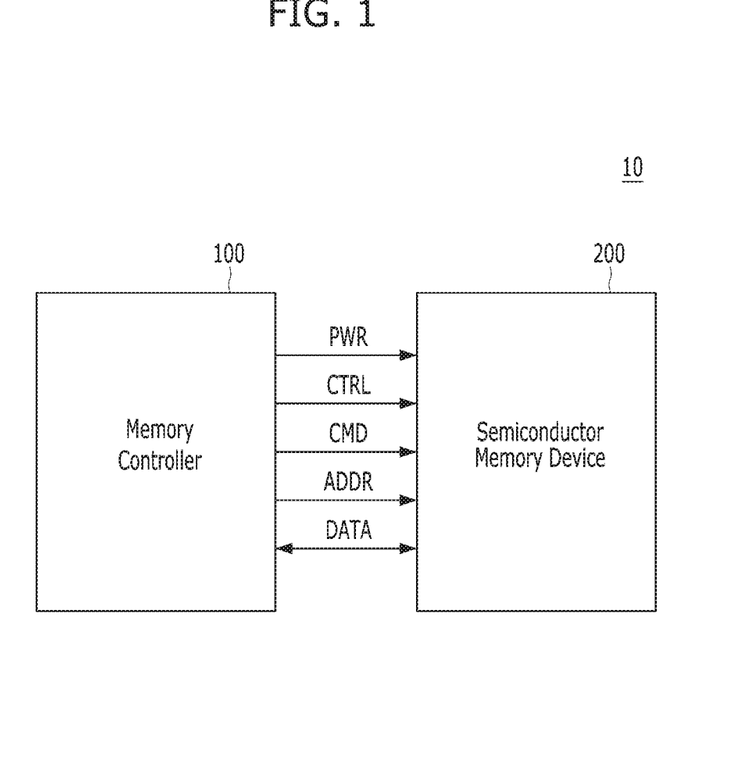
FIG. 1 is a block diagram schematically illustrating a memory system in accordance with an embodiment of the present invention.

FIG. 1 is a block diagram schematically illustrating a memory system in accordance with an embodiment of the present invention.

Referring FIG. 1, the memory system 10 may include a memory controller 100 and a semiconductor memory device 200, which may represent more than one such device. The semiconductor memory device(s) 200 may be flash memory device(s), particularly of the NAND-type.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
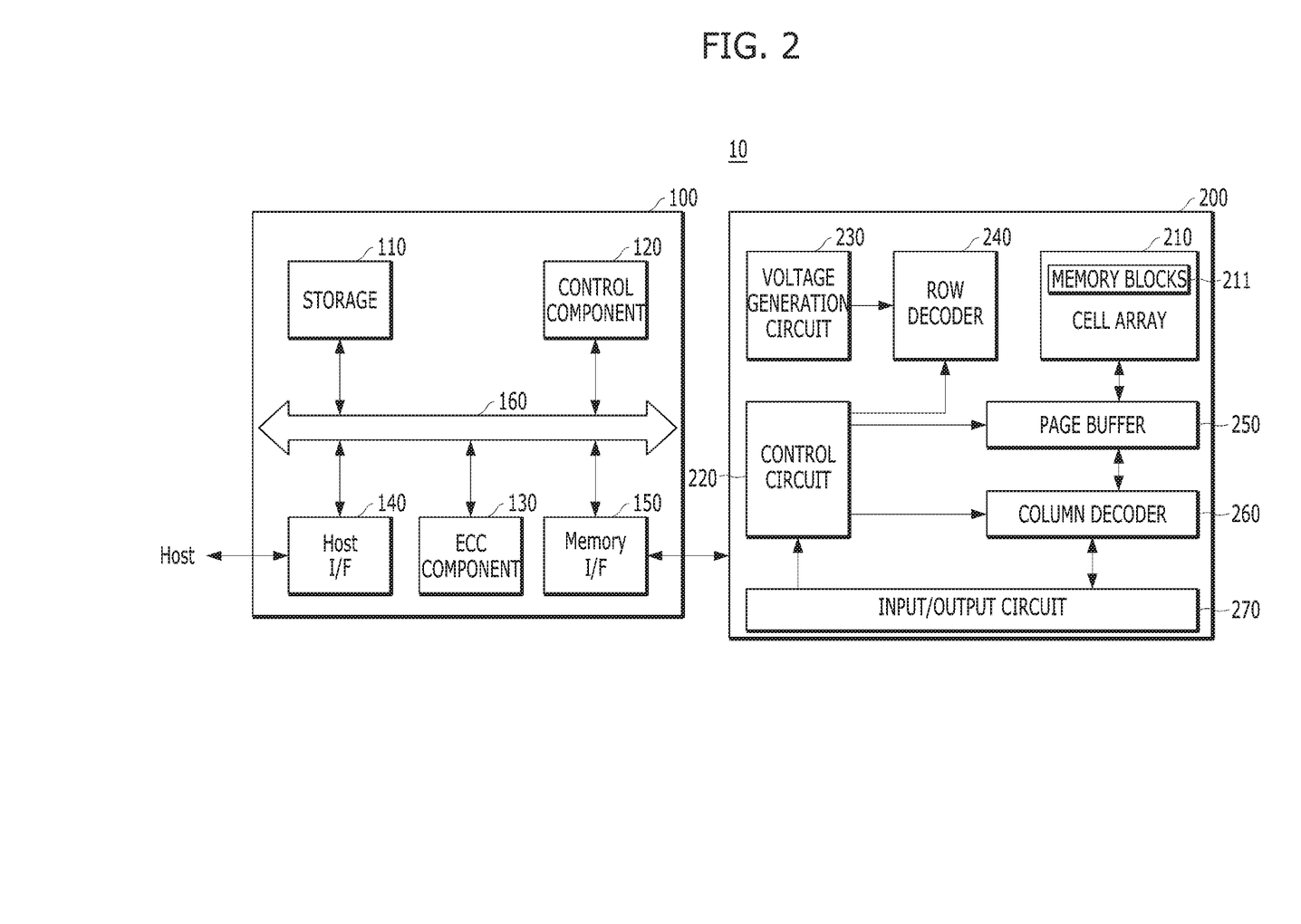
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In some embodiments, the ECC component 130 may perform an error correction operation based on a coded modulation such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). As such, the ECC component 130 may include all circuits, systems or devices for suitable error correction operation. In particular, the ECC component 130 may include an LDPC decoder.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
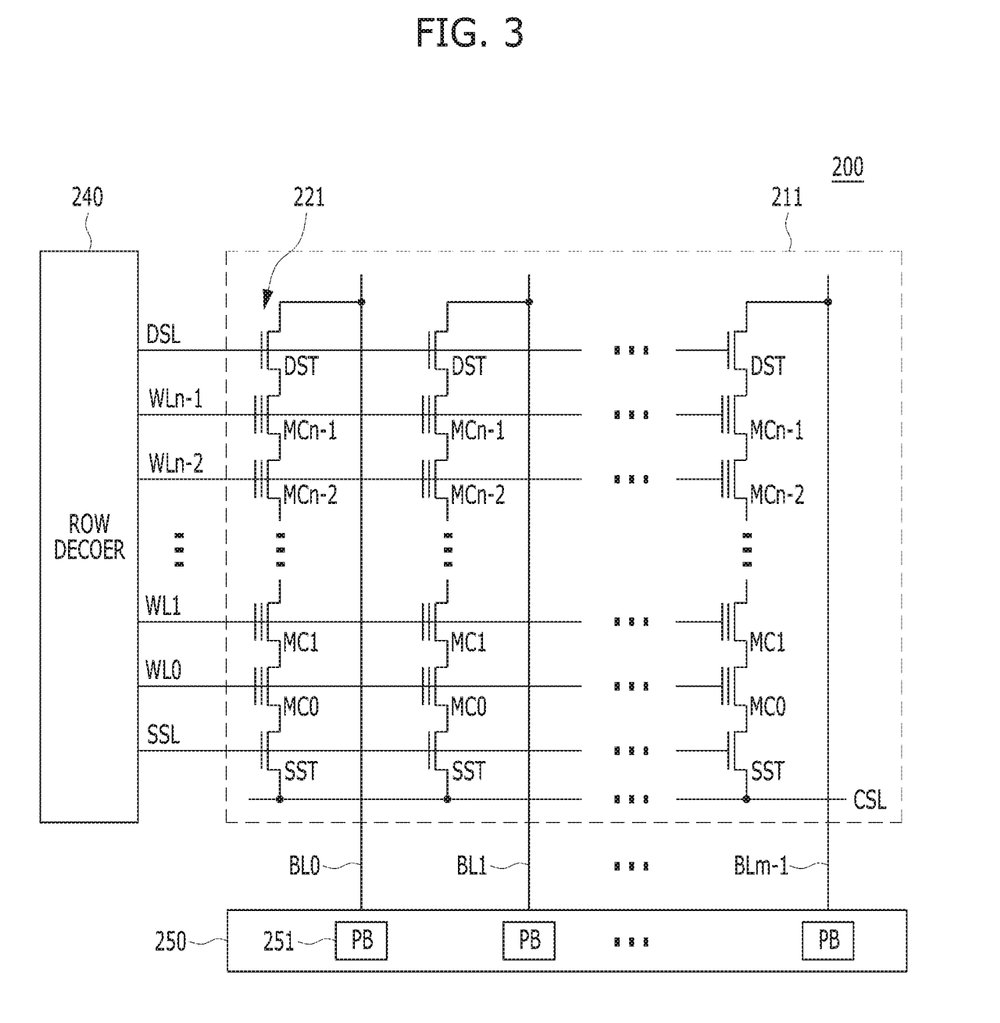
FIG. 3 is a circuit diagram illustrating a memory block of a memory device of a memory system in accordance with an embodiment of the present invention.

The page buffer 250 may be in electrical communication with the memory cell array 210 through bit lines BL (shown in FIG. 3). The page buffer 250 may pre-charge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit/receive data to/from the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1. The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
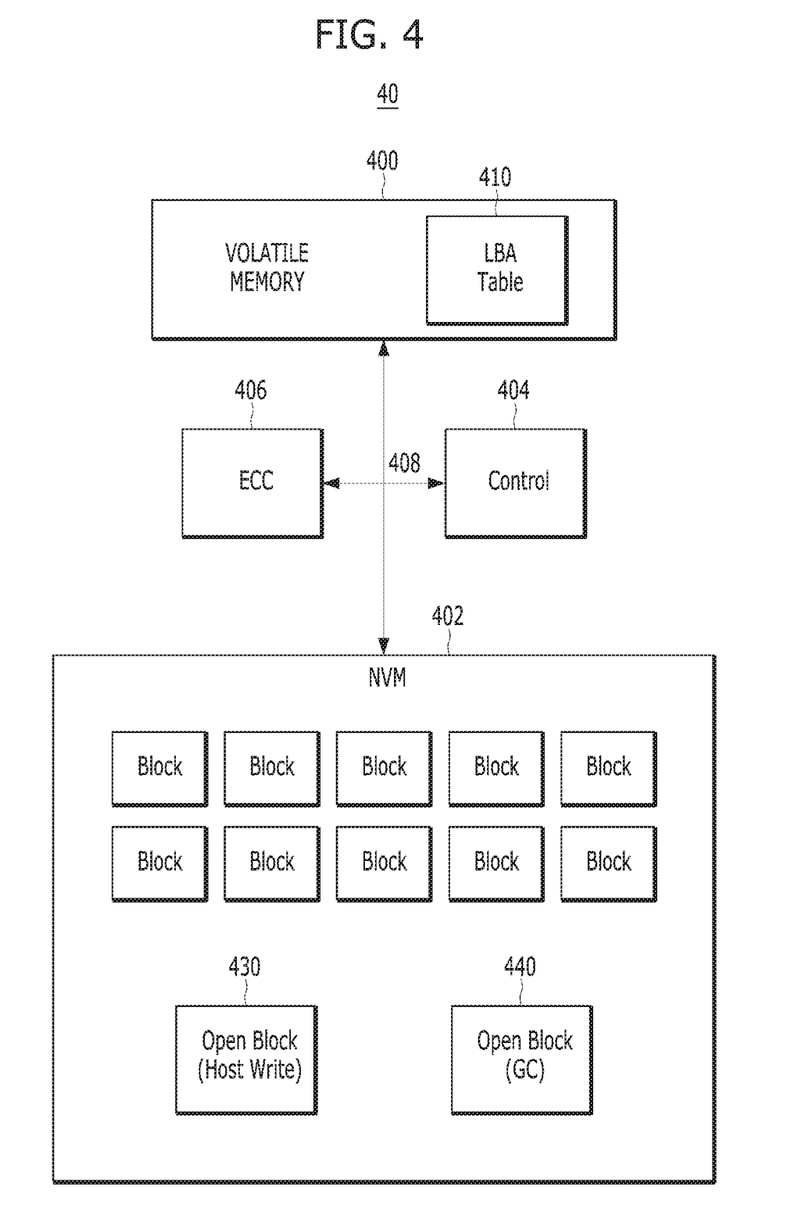
FIG. 4 is a schematic diagram of an exemplary memory system in accordance with an embodiment of the present invention.

Referring to FIG. 4, a general example of a memory system 40 is schematically illustrated. The memory system 40 may include a volatile memory 400 (e.g., a DRAM), a non-volatile memory (NVM) 402 (e.g., NAND), a control component or control logic 404, such as described herein, an error correcting code (ECC) module 406, such as described herein, and a bus 408 through which these components of the memory system 40 communicate. The volatile memory 400 may include a logical bit address LBA table 410 for mapping physical-to-logical addresses of bits. The NVM 402 may include a plurality of memory blocks (and/or a plurality of super memory blocks), as well as an open block for host writes 430 and an open block for garbage collection (GC) 440. FIG. 4 shows a general memory system. Additional/alternative components that may be utilized with memory systems to effectuate the present invention will be understood to those of skill in the art in light of this disclosure.

Aspects of the present invention are directed to soft-read suspend schemes for memory systems, e.g., SSDs. In some embodiments, such schemes may also predict whether soft decoding will be required, and if so, how many soft reads will be needed. In some embodiments, such schemes may also predict, after unsuccessful hard decoding, how many soft reads will be needed. In some embodiments, such schemes may also predict, during a soft read, whether, and if so how many, additional soft reads will be needed. Some schemes may be performed adaptively. Aspects of the present invention reduce overall command latency and improve the QoS of SSDs.

Figure 5:
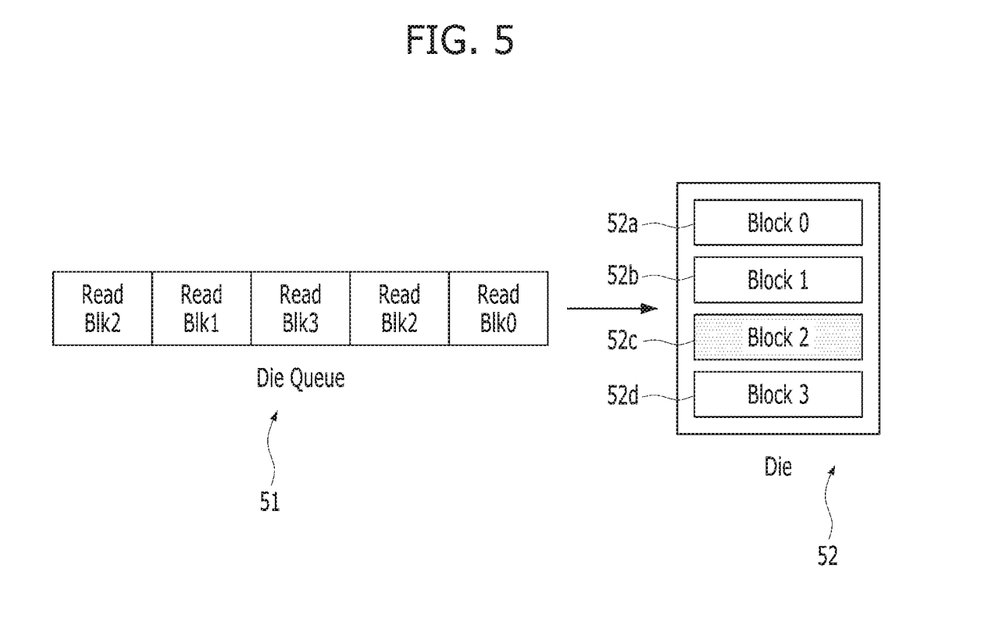
FIG. 5 is a schematic diagram showing a scenario in which at least some read commands in a die queue are directed to data in different blocks of the same die.

FIG. 5 shows a queue of read commands 51, each directed to data in a specific memory block, e.g., one of the memory blocks 211, of multiple blocks, in a die 52. For example, die 52 includes four blocks: (Block 0) 52a, (Block 1) 52b, (Block 2) 52c, and (Block 3) 52d. First to fifth read commands are queued in order. The first read command is directed to data in Block 2, the second read command is directed to data in Block 1, the third read command is directed to data in Block 3, the fourth read command is directed to data in Block 2, and the fifth read command is directed to data in Block 0.

Consider the case in which Block 2 (the target of the first read command) is noisy and each soft read takes 100 μs. Reading and successfully decoding data from Block 2 will likely result in a long latency, e.g., 700 μs. With no soft-read suspend scheme, that long latency blocks execution of a next-in-queue read command to a less noisy block, e.g., a read command to Block 1, in the same die, until the data read in response to the first-queued command is successfully decoded. In a scenario in which the next-in-queue read command directed to data in the less noisy block could be executed with one soft read and decoding operation, the latency of that read/decode operation would be only 100 μs, if that command could be executed immediately. However, with a long latency for the first-in-queue command to be successfully executed, the overall latency for execution of the next-in-queue command is 800 μs (700 μs for execution of the first command+100 μs for execution of the next command). This significantly increases the latency of the memory system, e.g., SSD, and thus reduces the QoS of the SSD.

Aspects of the present invention are directed to alleviating such situations and thereby reducing overall command latency. In accordance with embodiments of the present invention, adaptive soft-read suspend schemes are provided. In one such scheme, before soft decoding starts, an estimate of the number of errors in the data being read is made, and from that estimate, a prediction of whether and how many soft reads are likely necessary to successfully obtain correct data. In another such scheme, the estimation of the number of errors in the currently read data is made during the first soft read to predict whether and how many additional soft reads are likely necessary. The latter scheme may be repeated after each soft read/decoding failure taking into account the latest failure.

Figure 6:
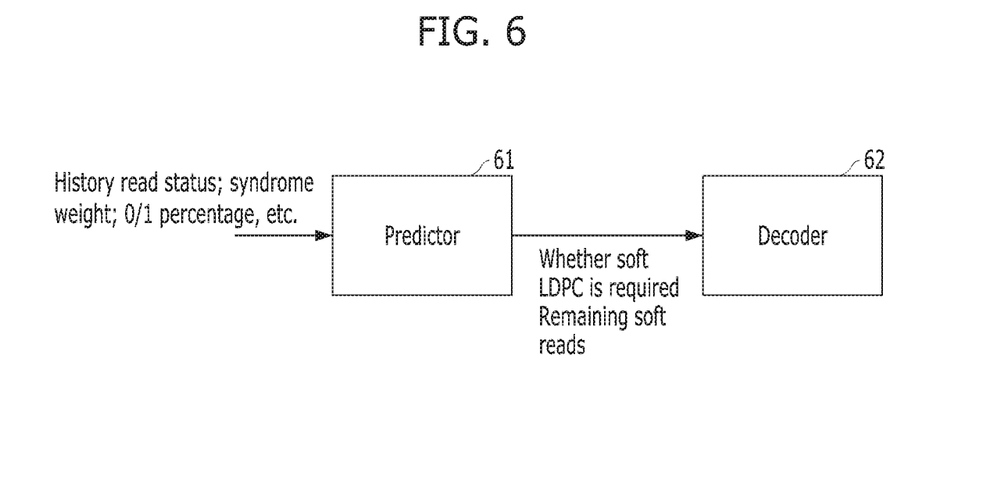
FIG. 6 is a schematic diagram of a predictor module, its functionality and its relationship to a decoder in accordance with an embodiment of the present invention.

Referring to FIG. 6, a predictor module 61 configured to make such estimation and prediction is illustrated. Predictor module 61 may be embodied in the memory controller 100 or controller 404. The predictor module 61 may be included in the ECC component 130, or the functionality of the predictor module 61 may be combined with that of ECC component 130 to form a single element within the memory controller 100 or controller 404. The output of the predictor module 61 may be provided to a decoder, e.g., an LDPC decoder, 62, which may be embodied in any larger component, e.g., controller 100, 404 or ECC component 130, in which the predictor module 61 is embodied.

The predictor module 61 may be used (i) before hard decoding to predict whether, and if so how many, soft reads will be needed, (ii) after unsuccessful hard decoding to predict how many soft reads (e.g., 2, 3, . . . , 7 or even more) will be needed, (iii) during or after the first soft read to predict whether, and if so how many, additional soft reads will be needed, and/or (iv) during or after any subsequent soft read, when decoding has yet to succeed, to predict whether, and if so how many, additional soft reads will be needed.

A framework may be set up for the predictions considering combinations of many features, indicative of the error-proneness of the read data. One such feature is the percentages of 0's and 1's for randomized data. If the percentage of 1's in such data is less than a first threshold, e.g., 48%, or greater than a second threshold, e.g., 52%, this may indicate that one or more (additional) soft reads are needed and that there may be a relatively long latency for the current read operation. Another feature is syndrome weight. A syndrome weight greater than a certain threshold tends to indicate that one or more (additional) soft reads are needed. Still another feature is history or past read success/failure to the same block or die. If a read operation performed in the relatively recent past, for data in the same block and/or die to which the current read operation is directed, required multiple soft reads, even with an optimized reference voltage, the current read command also may need multiple soft reads. In this case, the soft reads needed may also be due to deterioration of the die or long data retention. Other features suitable for estimating errors in data may also be used as a basis for the predictions.

These features, or sub-combination thereof, may be combined to make the predictions. Each of the features may be appropriately weighted. For example, the predictor module 61 may be implemented in a machine learning framework to adjust the weighting of applied features based on past performance to improve future predictions.

In an embodiment, a determination is made, based on the prediction from predictor module 61, whether soft decoding of a current read command is affecting QoS of the memory system 10, the controller 100 or 404 may suspend execution of that command and begin executing another read command that requires higher QoS or can be executed much faster. At some point, execution of the suspended read command will resume.

Figure 7:
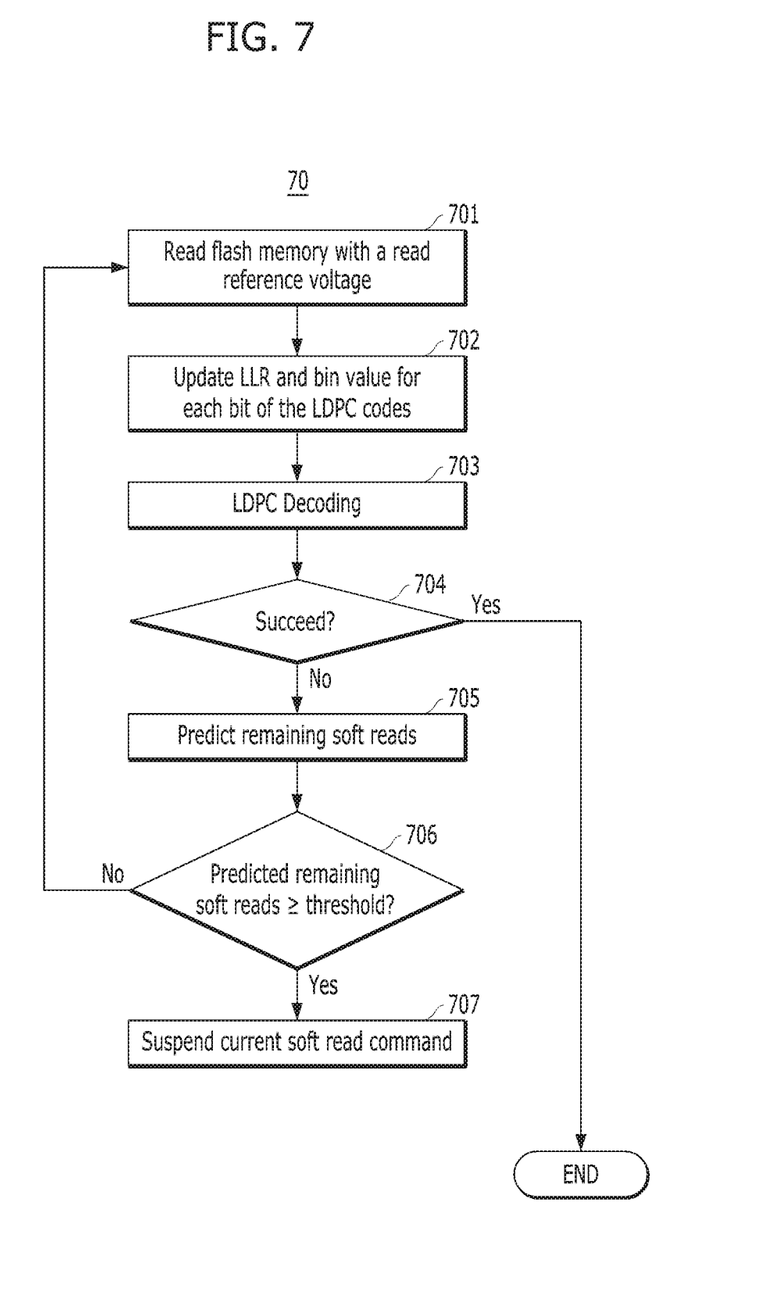
FIG. 7 is a flowchart of steps in a method of operating a memory system or device in accordance with an embodiment of the present invention.

FIG. 7 is a flow chart illustrating a soft read suspend flow when soft decoding, e.g., soft LDPC decoding, is already being executed. At step 701, a soft read is performed on the flash memory at a reference voltage in response to a current soft read command. At step 702, the log-likelihood ratio (LLR) and bin value of each bit of the LDPC codes generated in the soft read is updated. At step 703, soft LDPC decoding of the read data is attempted. At step 704, a determination is made by the controller 100, 404 whether soft decoding succeeded. If so (Yes at step 704), further reads of the current data are unnecessary, and further processing of the successfully decoded data may be performed. A subsequent soft read command also may be processed. In the context of the present flow, the process may end. If not (No at step 704), further operations are performed as follows.

At step 705 the predictor module 61 or its associated controller (e.g., memory controller 100 or controller 404) predicts how many more soft reads are required for successful soft decoding. Note that this prediction may be made after it is determined at step 704 that soft decoding for the previous soft read performed at step 701 failed, as shown in FIG. 7, or during the soft read at step 701.

Based on such prediction, together with information regarding the commands being blocked, e.g., their relative priorities and/or QoS requirements, the predictor module 61 (or associated controller) can determine whether to continue processing the current soft read command or to suspend such processing to service another read command. In an embodiment, such determination is made by comparing the predicted remaining soft reads with a threshold. The threshold may be set in accordance with whether blocking the next or other command high in the queue affects latency or other QoS metric, as noted above.

At step 706, the predicted number of remaining soft reads is compared with the threshold. If such predicted number is less than the threshold, execution of the current soft read command is not suspended, in which case the process flow returns to step 701 for a subsequent iteration, starting with a subsequent soft read.

On the other hand, if the determination at step 706 indicates that the predicted number of remaining soft reads is greater than or equal to the threshold, further processing of the current soft read command is suspended, the bin information of each cell and the stage of the soft read are backed up in controller internal SRAM or DRAM, e.g., storage 110. For example, if it is predicted at step 705, during a third iteration, that successful soft decoding requires seven soft reads, but only two soft reads have been executed, each bit will be assigned a bit LLR value or bin information to indicate that status. Such information is stored.

Accordingly, next time, when the processing of the current soft read command is resumed, all the backed up bin and soft information is copied back to the LDPC decoder 62. Doing that avoids repetition. That is, the controller 100, 404 knows from such information that it is not necessary to restart from the first and second reads. Rather, the controller 100, 404 only needs to start at the third read, and only the third, fourth, fifth, and sixth reads need to be executed.

Figure 8:
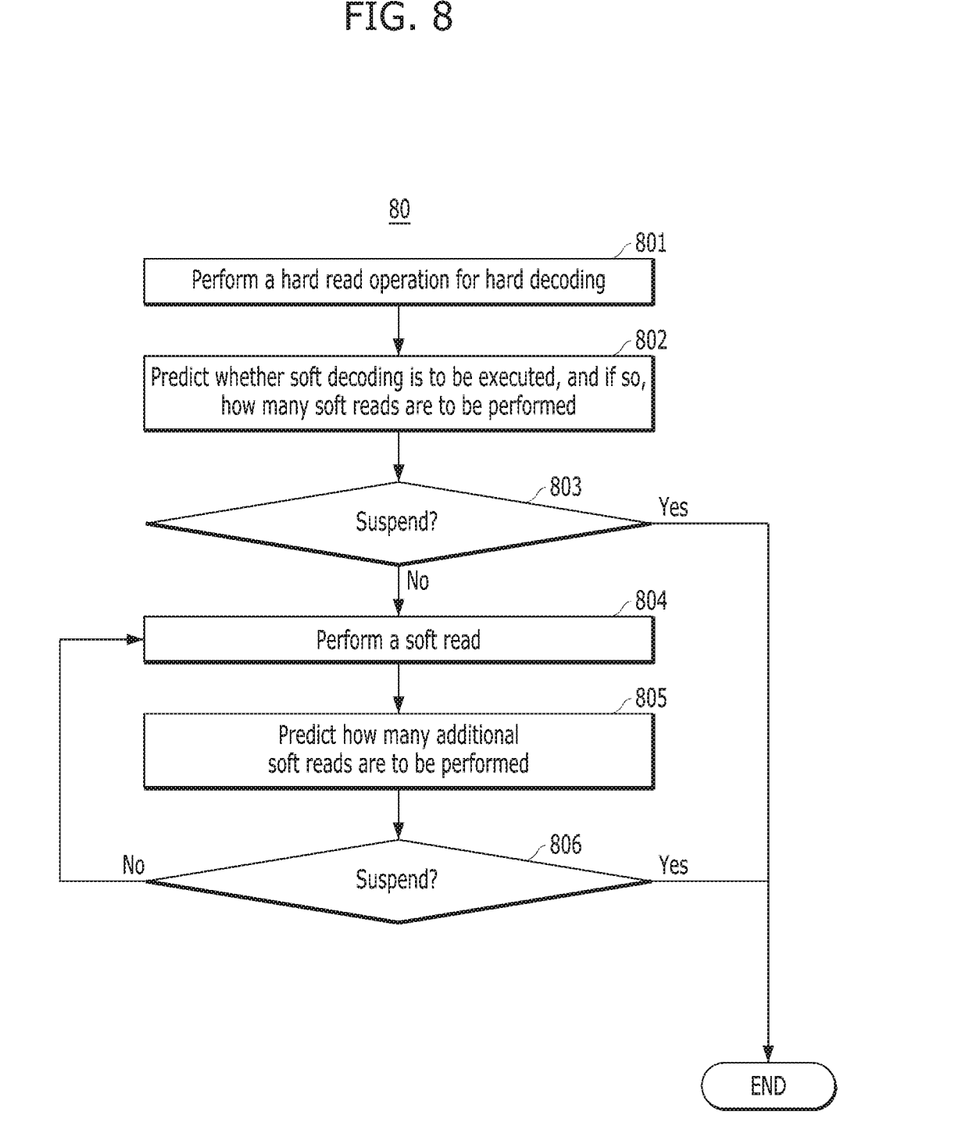
FIG. 8 is a higher level flowchart of steps in a method of operating a memory system or device to perform read/ decoding operations with a soft-read suspend scheme in accordance with an embodiment of the present invention.

FIG. 8 is a flow chart more generally describing steps in processes for determining whether to continue to read/decode in response to a current read command or suspend further processing in favor of executing another command, which may have a high priority, in accordance with an embodiment of the present invention. The steps shown in flow chart 80 are exemplary. Those skilled in the art will understand that additional or alternative steps may be performed, or that the order of the steps may be changed, in order to effectuate aspects of the present invention without departing from the inventive concepts disclosed herein. The steps of flow chart 80 may be performed by memory system components disclosed herein, such as a controller, predictor module, decoder, and/or other suitable components, any of which may be implemented with appropriate hardware, software, firmware or combination thereof.

Referring to FIG. 8, at step 801, a hard read operation is performed to generate hard information for hard decoding. At this point, i.e., before or immediately after hard decoding, e.g., hard LDPC decoding, at step 802, the predictor module 61 is deployed to predict whether soft decoding, e.g., soft LDPC decoding, will be needed and, so, how may soft reads will be needed. Based on such prediction, and assuming hard decoding failed, the controller 100, 404 determines at step 803 whether to continue with a soft read or suspend further processing of the current read command in favor of a higher priority command in the queue. For example, if the predicted number is high, i.e., greater than or equal to a threshold, the controller 100, 404 determines to suspend (Yes at step 803). In this case, a higher priority command in the queue may be executed. In the context of the current flow, the process may end. If the decision at step 803 is "No," the flow continues to step 804. Various factors and information may be taken into account in setting the threshold and hence making the determination.

At step 804, a soft read is performed. During or immediately after the soft read, the predictor module 61 is again deployed at step 805 to predict whether additional soft reads will be needed, and if so, how many. This again leads to a suspend decision at step 806.

If the decision at step 806 is not to suspend but rather continue with one or more additional soft reads in accordance with the prediction at step 805, the flow returns to step 804 for another soft read. The steps 804-806 are repeated until a decision is made at step 806 to suspend or the data read in response to the current command is successfully decoded. That is, after each soft read, remaining soft reads for successful soft decoding can be predicted. Such prediction is then used to determine whether to continue processing the current read command or to let another blocked command, e.g., a command with higher QoS requirement, be executed.

Once processing is suspended at either step 803 or step 806, all interim information such as bin counter information, the read reference voltage(s) already applied, and the stage of the soft read are recorded and stored. As a result, when processing of the current read command is resumed, the controller 100, 404 need only start from the point of suspension.

As the foregoing demonstrates, by making predictions related to the time associated with further reading/decoding of data in response to a current read command, intelligent decisions can be made as to whether to suspend further processing in response to such command in favor of executing a higher priority command. Such predictions and decisions may be made early in the process of reading/decoding data, and again later when the prior decision was to continue with the reading/decoding in response to the current command. A later prediction is able to take advantage of information generated at prior decision points. Accordingly, the present invention provides significant improvements in memory systems by helping to reduce overall command latency and thus improve the QoS of memory devices and their associated memory systems. Aspects of the present invention are particularly applicable in SSDs.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A method of operating a memory system, comprising:
controlling a memory device of the memory system, using a controller of the memory system, to perform, in response to a command in a queue of commands, a hard read to read data from the memory device to generate hard information for hard decoding;
predicting whether soft decoding of the data is to be performed, and if so, how many soft reads are to be performed for the soft decoding;
performing an initial soft read to read the data from the memory device when hard decoding fails and it is determined that at least one soft read is to be performed; and
predicting whether, and if so, how many, subsequent soft reads are to be performed for soft decoding of the data.

2. The method of claim 1, further comprising:
controlling the memory device to generate soft information for soft decoding from the initial soft read; and
determining whether to perform a first subsequent soft read on the data based on the soft information.

3. The method of claim 2, wherein the predicting steps are carried out using a predictor module of the controller, and wherein the predictor module predicts how many subsequent soft reads are to be performed to generate additional soft information for decoding the data based on at least one of history read status, syndrome weight, percentage of 0's or 1's in the read data.

4. The method of claim 3, wherein the predictor module employs machine learning to predict how many subsequent soft reads are to be performed to generate additional soft information for decoding the data.

5. The method of claim 2, wherein the determining step further comprises comparing the number of subsequent soft reads predicted with a threshold.

6. The method of claim 5, further comprising:
suspending execution of the command and not performing any subsequent soft read in response to the command, when the number of subsequent soft read predicted is determined to be greater than or equal to the threshold.

7. The method of claim 6, further comprising;
assigning a bin value for each bit of the read data;
updating the bin value for each bit after each soft read is performed; and
backing up the bin value for each bit after the command execution is suspended.

8. The method of claim 5, further comprising:
performing the first subsequent soft read on the data to generate soft information when the number of subsequent soft reads predicted is determined to be less than the threshold.

9. The method of claim 8, further comprising:
controlling the memory device to perform a second iteration of error correction decoding on the data read from the memory device using the hard and soft information generated in the hard and initial and first subsequent soft reads;
predicting how many subsequent soft reads are to be performed for decoding the data, when the second iteration of error correction decoding fails; and
determining whether to perform a second subsequent soft read on the data based on the prediction.

10. A memory system, comprising
a memory device; and
a memory controller configured to:
control the memory device to perform, in response to a command in a queue of commands, a hard read to read data from the memory device to generate hard information for hard decoding;
predict whether soft decoding of the data is to be performed, and if so, how many soft reads are to be performed for the soft decoding;

perform an initial soft read to read the data from the memory device when hard decoding fails and it is determined that at least one soft read is to be performed; and predict whether, and if so, how many, subsequent soft reads are to be performed for soft decoding of the data.

11. The memory system of claim 10, wherein the memory controller is further configured to:

control the memory device to generate soft information for soft decoding from the initial soft read; and determine whether to perform a first subsequent soft read on the data based on the soft information.

12. The memory system of claim 11, wherein the controller includes a predictor module that predicts how many subsequent soft reads are to be performed to generate additional soft information for decoding the data based on at least one of history read status, syndrome weight, percentage of 0's or 1's in the read data.

13. The memory system of claim 12, wherein the predictor module employs machine learning to predict how many subsequent soft reads are to be performed to generate additional soft information for decoding the data.

14. The memory system of claim 11, wherein, in performing the determine operation, the memory controller compares the number of subsequent soft reads predicted with a threshold.

15. The memory system of claim 14, wherein the memory controller is further configured to suspend execution of the command and not perform any subsequent soft read in response to the command, when the number of subsequent soft read predicted is determined to be greater than or equal to the threshold.

16. The memory system of claim 15, wherein a bin value is assigned for each bit of the read data, and the bin value for each bit is backed up after the command execution is suspended.

17. The memory system of claim 14, wherein the memory controller is further configured to perform the first subsequent soft read on the data to generate soft information when the number of subsequent soft reads predicted is determined to be less than the threshold.

18. The memory system of claim 17, wherein the memory controller is further configured to control the memory device to perform a second iteration of error correction decoding on the data read from the memory device using the hard and soft information generated in the hard and initial and first subsequent soft reads;

predict how many subsequent soft reads are to be performed for decoding the data, when the second iteration of error correction decoding fails; and determine whether to perform a second subsequent soft read on the data based on the prediction.

19. The memory system of claim 17, wherein a bin value is assigned for each bit of the read data, and the bin value for each bit is updated after each soft read is performed.

20. The memory system of claim 14, wherein the threshold is set based on a Quality of Service (QoS) requirement of at least one of a next command in the queue, the memory device, and the memory controller.

* * * * *